(12) United States Patent
Tanghe et al.

(10) Patent No.: US 9,960,752 B2
(45) Date of Patent: May 1, 2018

(54) SWITCHABLE TERMINATION WITH MULTIPLE IMPEDANCE SELECTIONS

(71) Applicant: LINEAR TECHNOLOGY CORPORATION, Milpitas, CA (US)

(72) Inventors: Steven Tanghe, Essex Junction, VT (US); Ciaran J. Brennan, Essex Junction, VT (US)

(73) Assignee: Linear Technology Corporation, Milpitas, CA (US)

(*) Notice: Subject to any disclaimer, the term of this patent is extended or adjusted under 35 U.S.C. 154(b) by 0 days. days.

(21) Appl. No.: 15/493,495

(22) Filed: Apr. 21, 2017

(65) Prior Publication Data

US 2017/0310306 A1 Oct. 26, 2017

Related U.S. Application Data

(60) Provisional application No. 62/326,334, filed on Apr. 22, 2016.

(51) Int. Cl.
*H03K 19/0175* (2006.01)
*H03K 17/689* (2006.01)
*H03H 11/30* (2006.01)
*H01L 27/02* (2006.01)
*H02M 3/07* (2006.01)

(52) U.S. Cl.
CPC ......... *H03H 11/30* (2013.01); *H01L 27/0251* (2013.01); *H02M 3/07* (2013.01); *H03K 17/689* (2013.01); *H03K 19/017509* (2013.01)

(58) Field of Classification Search
CPC ............ H04L 25/0298; H04L 25/0278; H04L 25/0272; H04L 25/0288; H04L 27/0251; H03K 19/0005; H03K 19/00384; H03K 19/017509; H03K 17/689; H03H 11/245; H03H 11/28; H03H 7/38; H03H 19/008; H03H 11/30; H02M 3/07
See application file for complete search history.

(56) References Cited

U.S. PATENT DOCUMENTS 5,084,667 A * 1/1992 Drori .................. G05B 19/075
323/298
6,147,520 A * 11/2000 Kothandaraman ...... H03H 7/24
327/308
6,157,335 A * 12/2000 Suzuki .................... G05F 3/242
341/144

(Continued)

*Primary Examiner* — Vibol Tan
(74) *Attorney, Agent, or Firm* — McDermott Will & Emery LLP

(57) ABSTRACT

Multiple termination impedance values are provided in a switchable termination circuit so as to accommodate multiple transmission line characteristics. In one example, a termination matching circuit includes first and second nodes, a series interconnection of a first switch and a first impedance coupled between the first and second nodes, and another series interconnection of a second switch and a second impedance coupled between the first and second nodes. First and second control circuits respectively control the first and second switches such that a selectable impedance is provided between the first and second nodes through selective activation of the first and second switch devices by the first and second control circuits. In another example, additional nodes and resistors are provided to provide further termination impedance values.

16 Claims, 5 Drawing Sheets

(56) References Cited

U.S. PATENT DOCUMENTS

| | | | | |
|---|---|---|---|---|
| 6,384,762 B2* | 5/2002 | Brunolli | ................ | H03M 1/682 341/144 |
| 6,812,734 B1* | 11/2004 | Shumarayev | ....... | H04L 25/0278 326/26 |
| 8,120,381 B2* | 2/2012 | Ko | ................. | H03K 19/017581 326/27 |
| 8,896,343 B2* | 11/2014 | Ge | ................. | H03K 19/017545 326/30 |
| 9,595,937 B2* | 3/2017 | Joish | ........................ | H03H 7/25 |
| 2002/0180507 A1* | 12/2002 | Yu | .................... | H03K 19/00376 327/307 |
| 2004/0251948 A1* | 12/2004 | Lee | ...................... | H03H 19/008 327/308 |
| 2005/0151576 A1* | 7/2005 | Lee | ...................... | H03H 11/245 327/334 |
| 2014/0145760 A1* | 5/2014 | Nguyen | ............. | H04L 25/0282 326/82 |

* cited by examiner

SWITCHABLE TERMINATION WITH MULTIPLE IMPEDANCE SELECTIONS

CROSS-REFERENCE TO RELATED APPLICATION

This application claims benefit to U.S. Provisional Application No. 62/326,334, filed on Apr. 22, 2016, the disclosure of which is incorporated by reference herein in its entirety.

BACKGROUND

To provide good power transfer and minimize signal reflection between a transmission line and a receiver, the input impedance of the receiver is preferably matched to the impedance of the transmission line. In cases in which the impedance of the transmission is known in advance, the receiver can be designed to have its impedance match the impedance of the transmission line. However, in situations in which the impedance of the transmission line is not known, or in situations in which the receiver is to be used with transmission lines having different impedances, the receiver cannot be designed to have its input impedance match the impedance of the transmission line.

A need therefore exists for a termination matching circuit having an adjustable impedance that can be adjustably set according to the needs of a particular application.

SUMMARY

The circuits and methods described herein provide a novel and efficient way to incorporate multiple termination impedance values in a switchable termination circuit so as to accommodate multiple transmission line characteristics.

In accordance with one aspect of the invention, a termination matching circuit includes first and second nodes, a first series interconnection of a first switch device and a first impedance element coupled between the first and second nodes, and a second series interconnection of a second switch device and a second impedance element coupled between the first and second nodes. First and second control circuits are respectively coupled to a control terminal of the first switch device and a control terminal of the second switch device. A selectable impedance is provided between the first and second nodes of the termination matching circuit through selective activation of the first and second switch devices by the first and second control circuits.

In accordance with another aspect of the invention, a termination matching circuit includes first, second, and third nodes; a series interconnection of a switch device and a first impedance element coupled between the first and second nodes; and a second impedance element coupled between the second and third nodes. A control circuit is coupled to a control terminal of the switch device, and a selectable impedance is provided at the nodes of the termination matching circuit through the activation of the switch device by the control circuit.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various circuits and methods disclosed herein relate to termination matching circuits used to improve an impedance match with a transmission line, such as an impedance match between a receiver or transceiver and a transmission line.

The termination matching circuits can be used to provide integrated switchable termination in integrated circuit receivers and transceivers used in communications systems. Using switchable termination, the termination matching can be selectively applied and/or the value of termination matching can be selectively adjusted to match the connected transmission line characteristic impedance. The circuits and methods presented herein provide a novel and efficient way to incorporate multiple termination resistor values in this feature so as to accommodate multiple transmission line characteristics.

Reference now is made in detail to the examples illustrated in the accompanying drawings and discussed below.

Figure 1A:
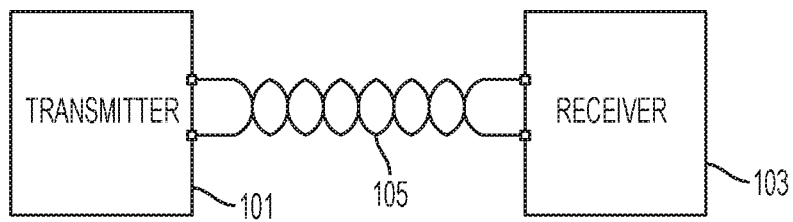
FIGS. 1A-1C are functional block diagrams showing transmitters and receivers connected through transmission lines and optionally including switchable termination circuits providing multiple termination impedance values.

FIG. 1A illustrates a general interconnection of a transmitter 101 and a receiver 103 across a transmission line 105 (or transmission cable). In the example of FIG. 1A, the receiver 103 may have a termination impedance (or termination resistance) that is not matched to the impedance (or resistance) of the transmission line 105 at the receiver's end. Such mismatch between the impedances of the receiver and transmission line may result in signal reflection at the receiver, for example.

Figure 1B:
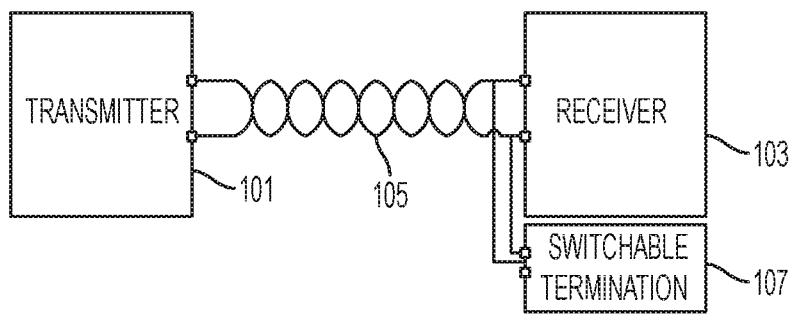

In order to improve matching between the impedances (or resistances) of the transmission line 105 and the receiver 103, and thereby reduce or minimize reflection of signals propagating through the transmission line 105 to the receiver 103, a termination matching circuit 107 may be used, as shown in FIG. 1B. The termination matching circuit 107, such as the "Switchable Termination" shown in FIG. 1B, can be coupled across the terminals of the transmission line 105 in parallel with the receiver 103. The termination matching circuit 107 may have an impedance (or resistance) across its terminals (or nodes) that improves the match between the impedance of the transmission line 105 and the termination impedance of the combination of the receiver 103 and termination matching circuit 107. Note that the receiver 103 may more generally be a transceiver or other device configured to receive or transmit signals across the transmission line 105. In other examples, the termination matching circuit 107 may be used with no receiver 103; in such examples, the termination matching circuit 107 can reduce signal reflection at an open end of the transmission line 105.

As illustratively shown in FIG. 1B, the termination matching circuit 107 may be a standalone component that is separate from the receiver 103. Alternatively, the termination matching circuit 107 may be fully integrated with the receiver 103, and may thus be coupled within the receiver 103 in parallel with the receiver's terminals or nodes, as illustratively shown in FIG. 1C. Note that the terms node and terminal are used synonymously in this disclosure.

Figure 2:
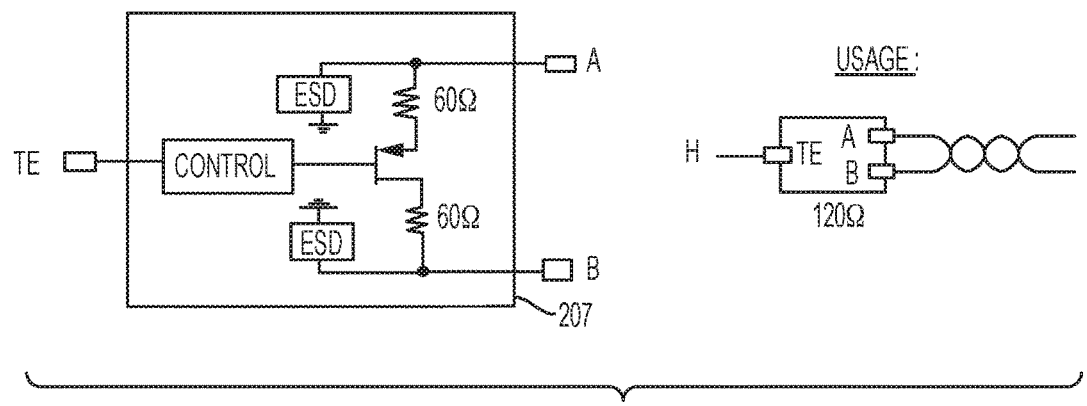
FIGS. 2-9 are functional circuit diagrams of exemplary switchable termination circuits providing multiple termination impedance values, as may be used in example interconnections of FIGS. 1A-1C.

FIG. 2 shows one exemplary device architecture for a switchable termination matching circuit 207 providing a 120 ohm termination impedance. In the device architecture of FIG. 2, a termination enable (TE) input is used to selectively activate or deactivate the termination matching circuitry. When the TE input is high (H), the control circuit turns the FET device ON to provide a 120 ohm (=60 ohm+60 ohm) termination impedance between the nodes/terminals A and B. The control circuit may include a charge pump circuit, level shifter circuit, or isolator circuit to enable the FET device to be driven with a voltage exceeding the supply voltage, for example. Additionally, electrostatic-discharge (ESD) circuits are coupled between each node/terminal (A, B) and ground in order to provide electrostatic-discharge protection to the termination matching circuitry. An ESD protection circuit or device protects the circuitry within an electronic device from electrostatic discharges or other surges of energy, in order to prevent a malfunction or damage to the electronic device and its circuitry. The ESD circuit generally includes a voltage clamping device that blocks unsafe operating conditions from the circuit or device it is protecting.

Depending on the application, the type of transmission line 105 or cable used, characteristics of the receiver 103, or the like, different termination impedance values may be needed to optimize the impedance matching provided by the termination matching circuit 107. For example, typical applications for differential termination include the RS485 or TIA/EIA-485-A standard that typically has a 120 ohm termination, or the RS422 or TIA/EIA-422-B standard that typically has a 100 ohm termination.

Figure 1C:
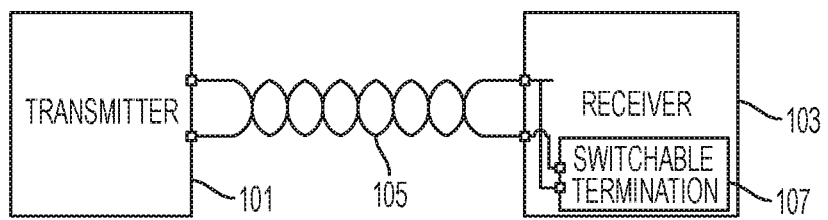

In order to provide a termination matching circuit 107 that can provide appropriate termination matching for different applications, a termination matching circuit 107 having an adjustable termination impedance (or resistance) may be needed. The switchable termination circuits of FIGS. 1B and 1C provide such an adjustable termination impedance, and illustrative embodiments thereof will be described in further detail below.

Figure 3:
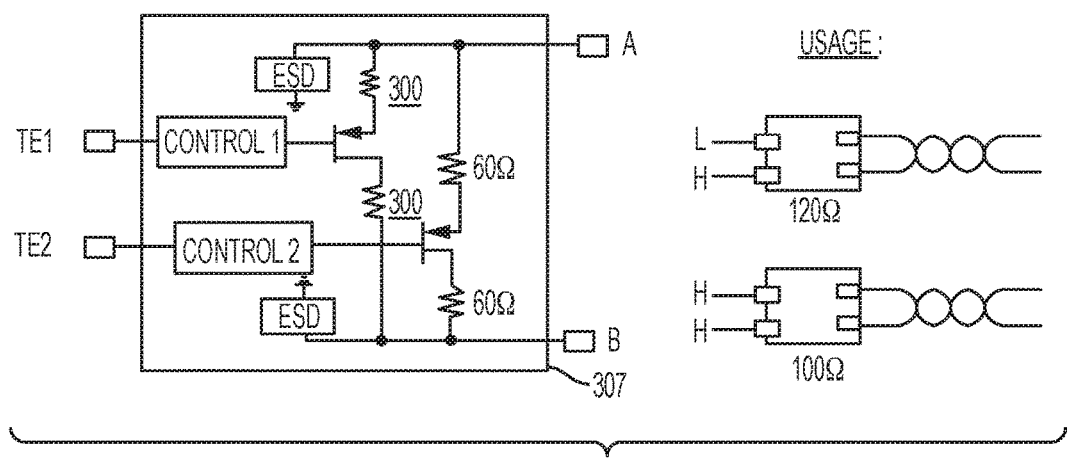

FIG. 3 shows one example of a switchable termination matching circuit 307. The circuit of FIG. 3 includes two termination enable (TE) inputs: TE1 and TE2. When TE1 is low and TE2 is high, control circuit 1 (Control 1) is turned off while control circuit 2 (Control 2) is turned on, and a 120 ohm termination impedance is provided between the nodes or terminals A and B. However, when both TE1 and TE2 are high, both control circuits 1 and 2 are turned on and a 100 ohm termination impedance (corresponding to 120 ohm in parallel with 600 ohm) is provided between the nodes or terminals A and B. The circuit of FIG. 3 can thus advantageously provide two different selectable impedance matching values between nodes or terminals A and B.

As in the case of FIG. 2, the circuit of FIG. 3 includes ESD circuits coupled to each node or terminal (A, B).

The discussion above describes two different termination impedance values that can be provided by the circuit of FIG. 3. More generally, other impedance values can be obtained. For example, by setting TE1 and TE2 to high and low values, respectively, control circuit 1 (Control 1) is turned on while control circuit 2 (Control 2) is turned off, and a 600 ohm termination impedance is provided between the nodes/terminals A and B. Additionally, by setting TE1 and TE2 to low values, both control circuits 1 and 2 are turned off and an open-circuit termination impedance is provided. As such, the two-input termination matching circuit of FIG. 3 can provide two or more (e.g., four) different selectable impedance matching values between nodes/terminals A and B. More generally, the circuit of FIG. 3 can be extended to include n termination enable inputs (TE1 . . . TEn), each connected to a respective control circuit (e.g., a respective one of n control circuits), FET (e.g., a respective one of n FETs), and set of one or more resistors or impedances (e.g., a respective one of n set of resistor(s) or impedance(s)). In such a general example, the circuit could provide up to $2^n$ different impedance termination values.

The example presented in FIG. 3 includes a total impedance of 600 ohms under control of the first control circuit and a total impedance of 120 ohms under control of the second control circuit, and can provide termination impedance values of 100 ohms, 120 ohms, 600 ohms, and open circuit. Other impedance values can be used. For example, by providing a total impedance of approximately 100 ohms under control of the first control circuit and a total impedance of approximately 120 ohms under control of the second control circuit, the termination matching circuit could provide termination impedance values of approximately 54.5 ohms, 100 ohms, 120 ohms, and open circuit. Note that while particular impedance values (e.g., 100 ohms, 120 ohms) are discussed herein for illustrative purposes, other impedance values can be used. For example, impedance values of approximately 100 ohms or 120 ohms can be used (e.g., 100 ohms+/−5%, 120 ohms+/−5%), as well as other impedance values (e.g., 20 ohms, 80 ohms, 1000 ohms, . . . ).

While the circuit of FIG. 3 advantageously provides switchable/selectable impedance termination, the circuit requires multiple termination enable inputs/signals, multiple control circuits (one for each TE input), multiple FET devices (one for each control circuit), and multiple sets of resistors. Because of the large numbers of components used in the circuit of FIG. 3, the circuit may be relatively expensive to implement. Additionally, if the circuit is to be expanded to include additional termination values (e.g., a third and/or a fourth different termination impedance value), third (and/or fourth) control circuits, FETs, and sets of resistors will be needed. For example, for the circuit to provide n termination impedance values (n being a positive integer), the circuit may include n sets of resistors coupled between the nodes/terminals A and B, n switch devices coupled in series with a respective one of the n sets of resistors, and n control circuits each controlling a respective one of n switch devices.

Figure 4:
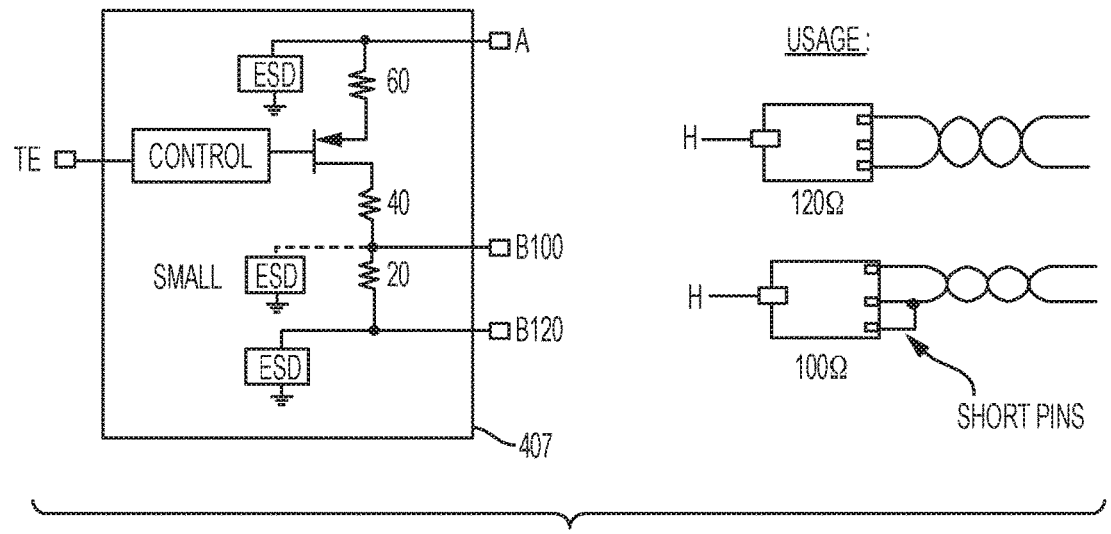

FIG. 4 provides another switchable impedance termination circuit 407 that requires fewer components than that of the circuit of FIG. 3.

In the circuit of FIG. 4, a single termination enable (TE) input, a single control circuit, and a single FET provide multiple different impedance matching values. The control circuit may be similar to the control circuits of FIGS. 2 and 3, and may include a charge pump, level shifter circuit, or isolator circuit to drive the gate of the FET device so as to activate the device. More generally, the control circuits of FIGS. 2, 3, and 4 can each include a voltage boosting circuit or a negative voltage generation circuit, depending on the type of switch used (whether an N-type FET, a P-type FET, or other switch type). The voltage boosting circuit(s) or negative voltage generation circuit(s) may each include a charge pump, level shifter circuit, or isolator circuit or other appropriate circuitry used to generate a control voltage to apply to the control terminal of the switch (e.g., to the gate of the FET device).

In use, the impedance matching value of the circuit of FIG. 4 is selected by adjusting the connectivity of the multiple output nodes or terminals of the impedance matching circuit 407. To provide a 120 ohm termination, the output nodes/terminals A and B120 are used to provide a 120 ohm (=60 ohm+40 ohm+20 ohm) termination impedance between the output nodes/terminals. Alternatively, if a 100 ohm termination is needed, the output nodes/terminals A and B100 are used to provide the 100 ohm (=60 ohm+40 ohm) termination impedance between the output nodes/terminals. The impedance values (e.g., 60 ohm, 40 ohm, 20 ohm, . . . ) discussed throughout this disclose are for illustrative purposes, and other impedance values can be used. For example, impedance values of approximately 60 ohm, 40 ohm, or 20 ohm can be used (e.g., 60 ohms+/−5%, . . . ), as well as other impedance values (e.g., 5 ohm, 500 ohm, 1000 ohm, . . . ).

As shown in FIG. 4, the switchable termination circuit 407 includes an ESD circuit at each of the nodes/terminals A, B100, and B120.

In order to obviate the need for an ESD circuit at node/terminal B100, the output nodes/terminals B100 and B120 can be short-circuited together when a 100 ohm output impedance is desired. The shorting of output nodes/terminals B100 and B120 effectively short-circuits the 20 ohm resistor. With the nodes/terminals B100 and B120 short-circuited to each other, a 100 ohm (=60 ohm+40 ohm) termination impedance is again provided between the output nodes/terminals A and B100/B120. Further, because of the short-circuit between the nodes/terminals B100 and B120, an ESD circuit may not be required at node/terminal B100. Thus, in examples in which a short-circuit is used between the nodes/terminals B100 and B120, only two ESD circuits connected to each of the nodes/terminals A and B120 are needed. However, a third ESD circuit can nonetheless optionally be provided at node/terminal B100 in order to provide electrostatic discharge protection to the node/terminal B100 at times when the node/terminal B100 is not short-circuited to node/terminal B120, such as during assembly. The third ESD circuit (connected to node/terminal B100) may be of a different size or capacity (e.g., smaller size or capacity) than those at nodes or terminals A and B120, or may be of a same size as those at nodes or terminals A and B120.

In the foregoing examples, the ESD circuits are shown as being provided between a node/terminal (e.g., A, B, B100, B120) and ground. Alternatively or additionally, an ESD circuit can be provided between nodes/terminals A and B (or A and B120) to provide protection of the FET D-S voltage. Additionally, the ESD circuit at node/terminal B100 can be connected between the node/terminal and ground, as shown in FIG. 4, or between the node/terminal B100 and the node/terminal B120. Further, the FET devices used in these circuits may be N-type or P-type, or another type of switch device can be used. In general, the FET resistance is non-zero and may be taken into account in the calculation of the termination impedance provided by the switchable termination impedance circuit.

The foregoing examples have focused on circuits providing two selectable values of impedance (e.g., 100 ohm and 120 ohm) at their nodes or terminals. More generally, the circuits can be designed to provide different values of impedance (e.g., 80 ohm, 140 ohm, . . . ), and/or to provide additional different impedance values (e.g., n different selectable values of impedance, where n is a positive integer). For instance, the circuit of FIG. 4 could be extended to include additional nodes/terminals and additional impedance termination values in accordance with the teachings presented herein. In one particular example, the circuit of FIG. 4 may be modified to include a fourth node/terminal B140, and an additional impedance element (e.g., a 20 ohm resistor) coupled between the nodes/terminals B120 and B140, so as to provide a third selectable impedance value of 140 ohms between the nodes/terminals A and B140. In this additional example, a full-size ESD circuit may be provided at node/terminal B140, and either no ESD circuit or a smaller-sized ESD circuit may be provided at node/terminal B120. Further nodes or terminals (e.g., B150, B160, . . . ) and further resistors (e.g., respectively connected between nodes/terminals B140 and B150, between nodes/terminals B150 and B160, . . . ) may be used to provide further selectable impedance values.

Figure 5:
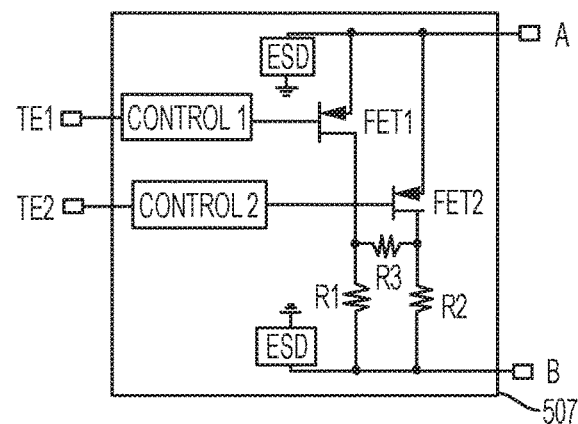

Further examples of device architectures for switchable termination matching circuits are provided in FIGS. 5-9. In the example of FIG. 5, a switchable termination matching circuit 507 is provided that is generally similar to the architecture shown in FIG. 3: switch device FET1 remain in series with resistor R1 between nodes/terminals A and B, while switch device FET2 remain in series with resistor R2 between nodes/terminals A and B. However, in circuit 507, at least one additional resistor (R3) is provided such that a resistor network is provided between the FET devices and node/terminal B. The termination impedances provided by the circuit 507 will thus be provided by the equivalent resistance of the resistor network, where the equivalent resistance of the resistor network is determined based on which of the FET devices are turned on. Specifically, if FET1 alone is turned on, a termination impedance of R1 in parallel with R2+R3 is provided; if FET2 alone is turned on, a termination impedance of R2 in parallel with R1+R3 is provided; and if FET1 and FET2 are both turned on, a termination impedance of R1 in parallel with R2 is provided. As a result, multiple different termination impedance values can be provided.

Figure 6:
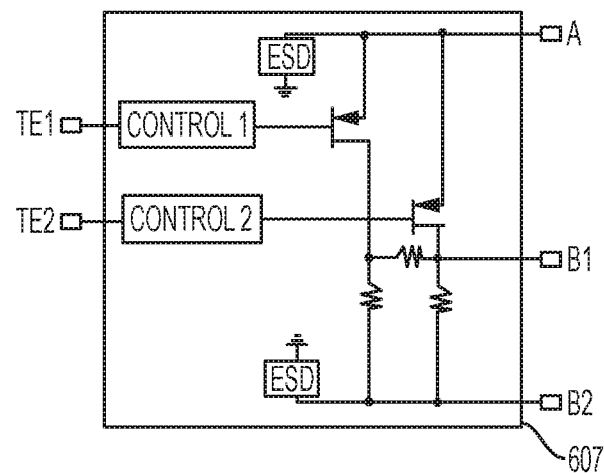
Figure 7:
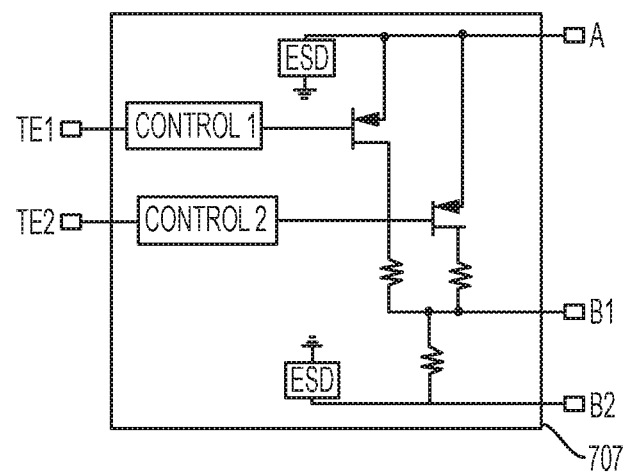

In the examples of FIGS. 6 and 7, switchable termination matching circuits 607 and 707 are provided that are combinations of the architectures of FIGS. 3 and 4. In circuits 607 and 707, multiple switch/FET devices are provided, and three or more output nodes/terminals are provided (e.g., A, B1, and B2). As a result, multiple different termination impedance values can be provided through the selective activation of the multiple switch/FET devices and through the selective use of the nodes/terminals A+B1 or A+B2. In particular, the termination impedances provided by the circuits 607 and 707 will be provided by the equivalent resistance of the resistor network, where the equivalent resistance of the resistor network is determined based on both which of the FET devices are turned on and which terminals (A+B1 or A+B2) are in use.

Figure 8:
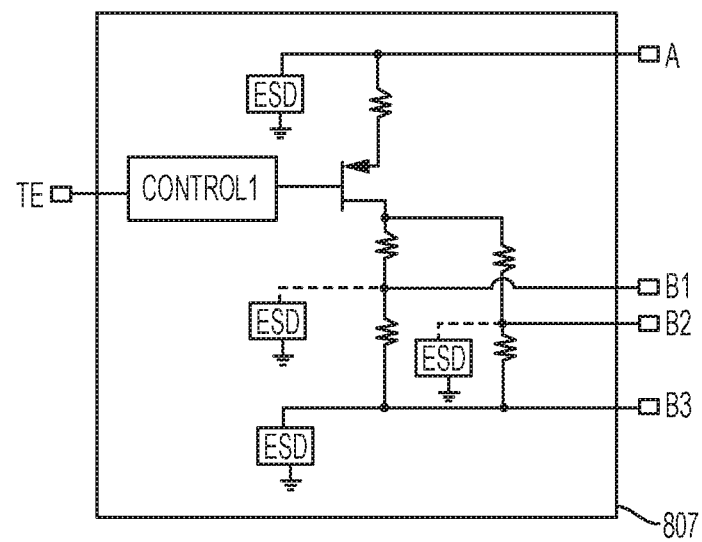
Figure 9:
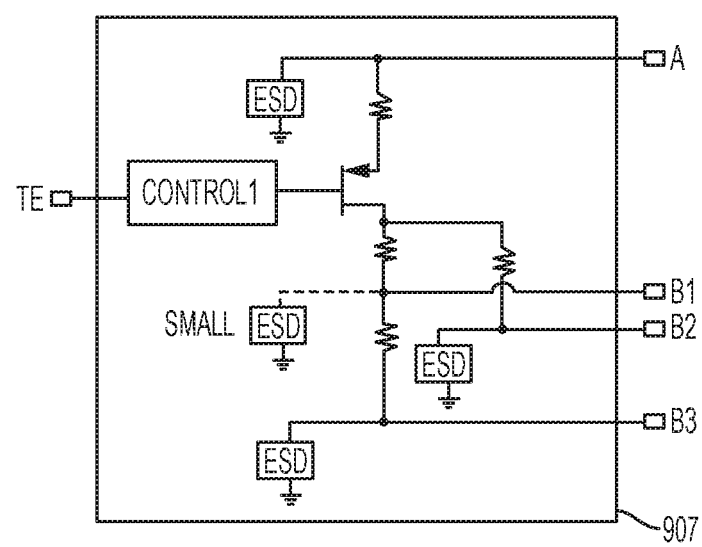

Finally, in the examples of FIGS. 8 and 9, switchable termination matching circuits 807 and 907 are provided that is generally similar to the architecture shown in FIG. 4: a single switch/FET device and a single control circuit provide multiple different impedance matching values. However, in circuits 807 and 907, a resistor network is provided between the switch/FET device and the various output terminals B1, B2, and B3. The termination impedance provided by the circuits 807 and 907 will thus be provided by the equivalent resistance of the resistor network, where the equivalent resistance of the resistor network is determined based on which of the output nodes/terminals B1, B2, and B3 are used (and/or are short-circuited). As a result, multiple different termination impedance values can be provided.

As described above, the control circuit(s) in each of the switchable termination matching circuits are used to selectively enable/open or disable/close the corresponding switch devices (e.g., FET devices). In some examples, the control circuit(s) may include memory elements, such as non-volatile memory or latches, such that each control circuit can maintain its state (e.g., enabling/opening or disabling/closing the corresponding switch device) even when no control input is received at the TE input. In such examples, a switchable termination matching circuit can be programmed by setting each memory element to the desired value and, once programmed, the switchable termination matching circuit can be used without requiring input of TE signals during operation. In this way, the switchable termination matching circuit, once programmed, can be used even in devices that do not provide TE signals to the termination matching circuit.

While not shown in the figures, the various switchable termination matching circuits shown and described herein generally receive external power for operation. For this purpose, each switchable termination matching circuit may include a power supply (e.g., Vdd) terminal at which power is received and a ground terminal. Power from the power supply terminal is used to power the operation of the control circuit(s), including the powering of charge pump, level shifter, or isolator circuitry when such circuitry is provided in a control circuit. In such situations, the charge pump, level shifter, or isolator circuitry may use power received from the power supply terminal to drive the gate of the FET device to a voltage higher than the supply terminal voltage (or, in some examples, lower than the lower supply terminal voltage or ground voltage). In alternative examples, the control circuits may derive power from the TE inputs of the switchable impedance termination circuit, and the switchable impedance termination circuits in such examples may thus not require separate power supply terminals. In further examples, the control circuits may derive power from the transmission line connected to the switchable impedance termination circuit, and the switchable impedance termination circuits in such examples may thus not require separate power supply terminals.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A termination matching circuit comprising:
    first and second nodes;
    a first series interconnection of a first switch device and a first impedance element coupled between the first and second nodes;
    a second series interconnection of a second switch device and a second impedance element coupled between the first and second nodes;
    a third impedance element coupled to and between the first switch device at the first series interconnection and to the second switch device at the second series interconnection; and first and second control circuits respectively coupled to a control terminal of the first switch device and a control terminal of the second switch device, wherein a selectable impedance is provided between the first and second nodes of the termination matching circuit through selective activation of the first and second switch devices by the first and second control circuits.

2. The termination matching circuit of claim 1, wherein a first selectable impedance value is provided between the first and second nodes of the termination matching circuit by selectively activating only the first switch device from between the first and second switch devices, and a second selectable impedance value lower than the first selectable impedance value is provided between the first and second nodes of the termination matching circuit by activating both the first and second switch devices.

3. The termination matching circuit of claim 1, further comprising first and second electrostatic-discharge (ESD) circuits respectively coupled to the first and second nodes.

4. The termination matching circuit of claim 1, further comprising a third electrostatic-discharge (ESD) circuit coupled between the first and second nodes.

5. The termination matching circuit of claim 1, wherein each of the first and second control circuits drives a respective one of the first and second switch devices.

6. The termination matching circuit of claim 1, wherein the termination matching circuit selectively provides an impedance substantially equal to 100 ohms between the first and second nodes through selective activation of at least one of the first and second switch devices by the first and second control circuits, and provides approximately 120 ohm impedance between the first and second nodes through the selective activation of at least one of the first and second switch devices by the first and second control circuits.

7. The termination matching circuit of claim 6, wherein the first impedance element of the first series interconnection has a value substantially equal to 120 ohms, and the second impedance element of the second series interconnection has a value of approximately 600 ohms.

8. The termination matching circuit of claim 1, further comprising:
n series interconnections of a respective switch device and a respective impedance element coupled between the first and second nodes, where n is a positive integer; and
n control circuits each coupled to a control terminal of the switch device of a respective one of the n series interconnections,
wherein a selectable impedance is provided between the first and second nodes of the termination matching circuit through selective activation of the switch devices of the first, second, and n series interconnections by the first, second, and n control circuits.

9. A termination matching circuit comprising:
first, second, and third nodes;
a series interconnection of a switch device and a first impedance element coupled between the first and second nodes;
a second impedance element coupled between the second and third nodes; and
a control circuit coupled to a control terminal of the switch device,
wherein a first selectable impedance value is provided between the first and second nodes of the termination matching circuit through activation of the switch device by the control circuit, and a short-circuiting of the second node to the third node, and a second selectable impedance value higher than the first selectable impedance value is provided between the first and third nodes of the termination matching circuit through activation of the switch device when the second and third nodes are not short-circuited.

10. The termination matching circuit of claim 9, further comprising:
n nodes, where n is a positive integer; and
n impedance elements connected in series with each other between the third node and one of the n nodes, wherein each of the other nodes of the n nodes is coupled to a respective node of the series connection of n impedance elements,
wherein n selectable impedance values higher than each of the first and second selectable impedance values are provided between the first and n nodes of the termination matching circuit by activating the switch device.

11. The termination matching circuit of claim 9, further comprising first and second electrostatic-discharge (ESD) circuits respectively coupled to the first and third nodes.

12. The termination matching circuit of claim 11, further comprising a third ESD circuit coupled to a third impedance element, between the first and third nodes.

13. The termination matching circuit of claim 9, wherein the control circuit is configured to drive the switch device.

14. The termination matching circuit of claim 9, wherein the termination matching circuit selectively provides an impedance substantially equal to 100 ohms between the first and second nodes and approximately 120 ohm impedance between the first and third nodes.

15. The termination matching circuit of claim 14, wherein the second impedance element coupled between the second and third nodes has a value substantially equal to 20 ohms.

16. The termination matching circuit of claim 1, wherein activation of only the first switch device places the first impedance element in parallel with a series connection of the second and third impedance elements, and wherein activation of only the second switch device places the second impedance element in parallel with a series connection of the first and third impedance elements.

* * * * *